(12) United States Patent
Miyake

(10) Patent No.: US 10,752,127 B1
(45) Date of Patent: Aug. 25, 2020

(54) BATTERY CONTROLLER AND METHOD OF BATTERY CONTROL

(71) Applicant: DENSO TEN Limited, Kobe-shi, Hyogo (JP)

(72) Inventor: Ryuusuke Miyake, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/709,022

(22) Filed: Dec. 10, 2019

(30) Foreign Application Priority Data

Mar. 29, 2019 (JP) .................. 2019-068371

(51) Int. Cl.
| | | |
|---|---|---|
| *B60L 58/22* | (2019.01) | |
| *B60L 58/12* | (2019.01) | |
| *G01R 31/3842* | (2019.01) | |
| *B60L 3/04* | (2006.01) | |
| *H02J 7/00* | (2006.01) | |
| *H01M 10/44* | (2006.01) | |
| *H01M 10/42* | (2006.01) | |
| *B60L 3/00* | (2019.01) | |

(52) U.S. Cl.
CPC ............. *B60L 58/12* (2019.02); *B60L 3/0046* (2013.01); *B60L 3/04* (2013.01); *B60L 58/22* (2019.02); *G01R 31/3842* (2019.01); *H01M 10/425* (2013.01); *H01M 10/441* (2013.01); *H02J 7/0014* (2013.01); *B60L 2210/10* (2013.01); *H01M 2010/4271* (2013.01)

(58) Field of Classification Search
CPC ...... H02J 7/0014; B60L 58/22; B60L 3/0046; B60L 3/04; G01R 31/3842; H01M 10/441

USPC ....... 320/118, 119, 121, 122, 125, 132, 134, 320/163, 104

See application file for complete search history.

(56) References Cited

U.S. PATENT DOCUMENTS

| | | | | |
|---|---|---|---|---|
| 5,905,360 | A * | 5/1999 | Ukita ................... | B60K 6/28 320/118 |
| 2006/0214636 | A1* | 9/2006 | Arai ...................... | H02J 7/0016 320/116 |
| 2011/0074354 | A1* | 3/2011 | Yano .................... | H01M 10/441 320/116 |
| 2013/0106356 | A1* | 5/2013 | Nakao .................... | B60L 58/21 320/118 |

FOREIGN PATENT DOCUMENTS

| | | |
|---|---|---|
| JP | 2014-231324 A | 12/2014 |
| JP | 2018-050416 A | 3/2018 |
| WO | 2013/035183 A1 | 3/2013 |

* cited by examiner

*Primary Examiner* — Edward Tso
*Assistant Examiner* — Aaron Piggush
(74) *Attorney, Agent, or Firm* — Oliff PLC

(57) ABSTRACT

A battery controller of an embodiment includes an auxiliary battery, a connection control unit, a calculating unit, and a balancing control unit. The auxiliary battery is a lithium ion secondary battery that is connectable to or disconnectable from an auxiliary power line of a vehicle. The connection control unit disconnects the battery from the auxiliary power line under a certain condition of the vehicle. The calculating unit calculates the state of charge of the battery when the battery is disconnected by the connection control unit. The balancing control unit executes balancing control to equalize the amount of charge between cells of the battery when the battery is disconnected by the connection control unit.

5 Claims, 3 Drawing Sheets

BATTERY CONTROLLER AND METHOD OF BATTERY CONTROL

CROSS-REFERENCE TO RELATED APPLICATION

This application is based upon and claims the benefit of priority of the prior Japanese Patent Application No. 2019-068371, filed on Mar. 29, 2019, the entire contents of which are incorporated herein by reference.

FIELD

The embodiment discussed herein is directed to a battery controller and a method of battery control.

BACKGROUND

Conventional electric power supply systems mounted on hybrid electric vehicles (HEV) and electric vehicles (EV) use electric power of a high-voltage battery as power for operating auxiliary equipment by stepping down the voltage of the electric power using a DC-DC converter and accumulating the power in a lead battery (for example, see Japanese Laid-open Patent Publication No. 2014-231324).

The European Union (EU) adopted the directive on the restriction of the use of certain hazardous substances in electrical and electronic equipment, or, the restriction of hazardous substances directive (RoHS). The directive designates several kinds of substances including lead as hazardous substances and restricts their use.

Furthermore, it is likely that the End-of Life Vehicles Directive (the ELV directive), which is an environmental policy addressing end-of-life vehicles, restricts use of lead batteries for new model vehicles, after January, 2022.

A lithium-ion rechargeable battery (LiB) as replacement of a lead battery has therefore been studied for use as an auxiliary battery in the above electric power supply system.

Replacing a lead battery with an LiB for an auxiliary battery, however, has issues of the accuracy and the quality of electric power supply.

For example, use of an LiB needs processes such as calculating the state of charge (SOC) of the LiB based on the open circuit voltage (OCV) and equalizing the energy capacity between cells connected in series in a battery pack of the LiB, with the LiB disconnected from the electric power supply system.

The LiB used as an auxiliary battery has to be continuously connected to the supply system from the DC-DC converter because of the necessity of dark current. In this circumstance, neither calculation of the SOC nor equalization in the amount of charge between cells can be conducted, which problematically causes, for example, accumulation of errors of the SOC and variation of the energy capacity between cells.

SUMMARY

A battery controller according to an embodiment includes an auxiliary battery, a connection control unit, a calculating unit, and a balancing control unit. The auxiliary battery is a lithium ion secondary battery that is connectable to or disconnectable from an auxiliary power line of a vehicle. The connection control unit disconnects the battery from the auxiliary power line under a certain condition of the vehicle. The calculating unit calculates the state of charge of the battery when the battery is disconnected by the connection control unit. The balancing control unit executes balancing control to equalize the amount of charge between cells of the battery when the battery is disconnected by the connection control unit.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF EMBODIMENT

An embodiment of a battery controller and a method of battery control of the present application will now be described in detail with reference to the accompanying drawings. The following embodiment is not intended to limit the present invention.

A battery controller BC to which a method of battery control of the embodiment is adapted includes, but is not limited to, a vehicle-installed battery pack 10 (see FIG. 2A) and an upper electronic control unit (ECU) 6 of the battery pack.

Figure 1A:
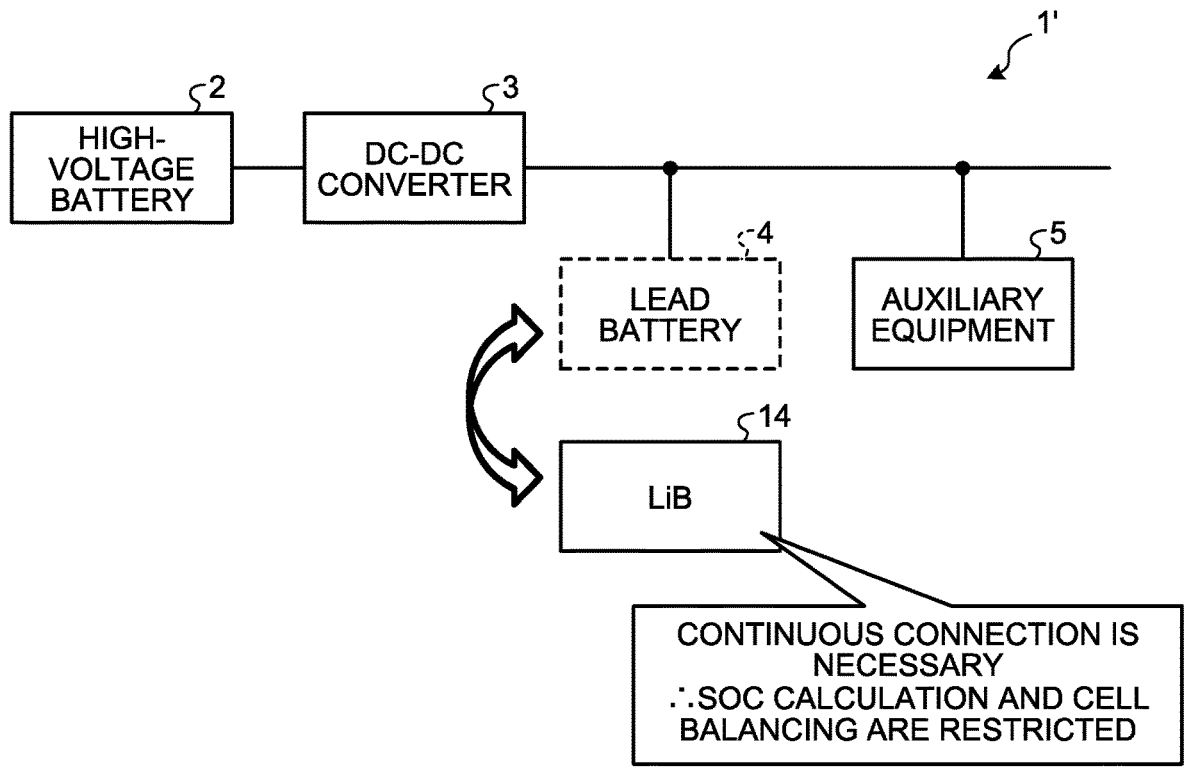
FIG. 1A is a first overview that illustrates a method of battery control of an embodiment.
Figure 1B:
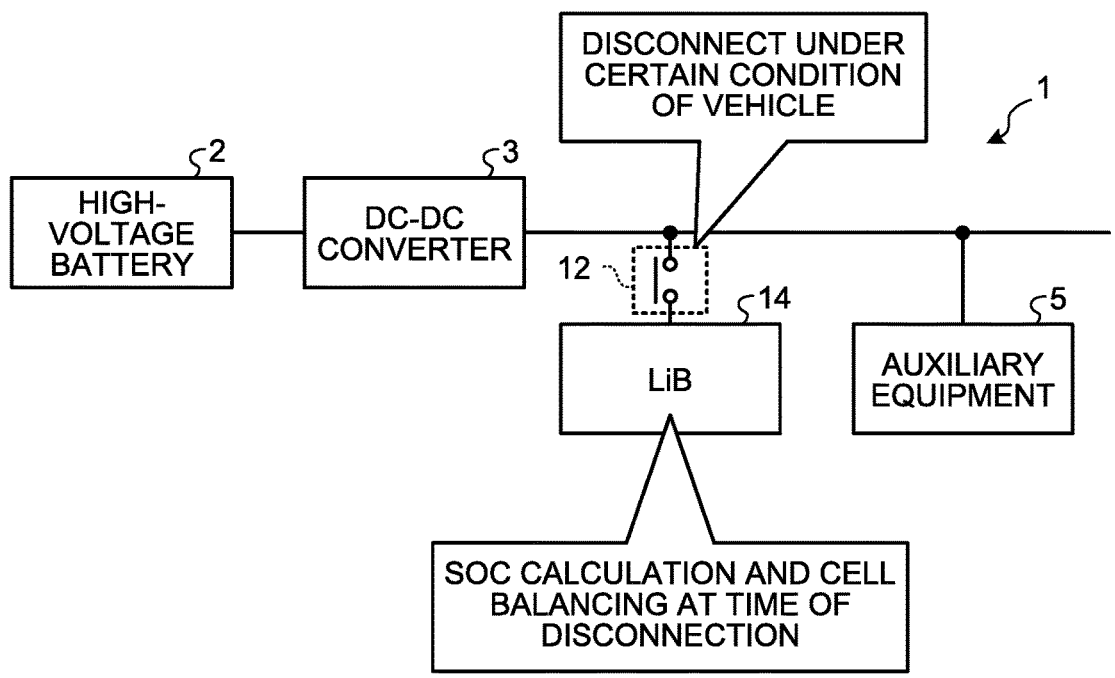
FIG. 1B is a second overview that illustrates the method of battery control of the embodiment.

An overview of the method of battery control of the embodiment will now be described with reference to FIG. 1A and FIG. 1B. FIG. 1A and FIG. 1B are the first and the second overviews that illustrate the method of battery control of the embodiment.

FIG. 1A illustrates an electric power supply system 1' of a comparative example. The electric power supply system 1' includes a high-voltage battery 2, a DC-DC converter 3, a lead battery 4, and auxiliary equipment 5.

The high-voltage battery 2 is a main battery mounted on an HEV, EV, and the like to supply high-voltage electric power to a traction motor (not illustrated), through an inverter (not illustrated) while the vehicle is powered by the traction motor.

When the traction motor functions as a generator in stopping and slowing the vehicle, the high-voltage battery 2 inputs the generated electric power through the inverter and accumulates the power. The DC-DC converter 3 steps down the voltage of electric power supplied from the high-voltage battery 2 to a low voltage (for example, 12 V), depending on an auxiliary electric power supply system for operating the auxiliary equipment 5.

The lead battery 4 is an auxiliary battery and accumulates electric power having a voltage stepped down by the DC-DC converter 3. Electric power accumulated in the lead battery 4 as well as electric power from the DC-DC converter 3 is supplied to the auxiliary equipment 5. The auxiliary equipment 5 includes, for example, various electric components mounted on the vehicle and an electric power steering (EPS).

Such types of lead battery 4 have been replaced by an LiB 14 illustrated in FIG. 1A in an attempt to comply with the RoHs and the ELV directives of EU. In use of the LiB 14 as an auxiliary battery, however, the LiB 14 needs to be continuously connected with the system. This circumstance restricts SOC calculation and cell balancing.

As illustrated in FIG. 1B, the method of battery control of this embodiment uses the LiB 14 instead of the lead battery 4 as an auxiliary battery. In this method, the LiB 14 is configured to be disconnected under a certain condition of the vehicle. Examples of the "certain condition of the vehicle" include a timing which does not interfere with operation of the vehicle in a running standby state, such as the timing in which the ignition (IG) is on with the travel speed staying zero.

As illustrated in FIG. 1B, the method of battery control of the embodiment performs SOC calculation and cell balancing at the time of disconnecting the LiB 14.

The method of battery control of the embodiment thus can reduce accumulation of errors of SOC and reduce variation of the energy capacity between cells, which are caused due to the absence of SOC calculation and cell balancing. The method of battery control of the embodiment therefore ensures the accuracy and the quality of electric power supply.

The above method of battery control of the embodiment is adapted to the battery controller BC, and an example configuration of an electric power supply system 1 including the battery controller BC will now be described in detail.

Figure 2A:
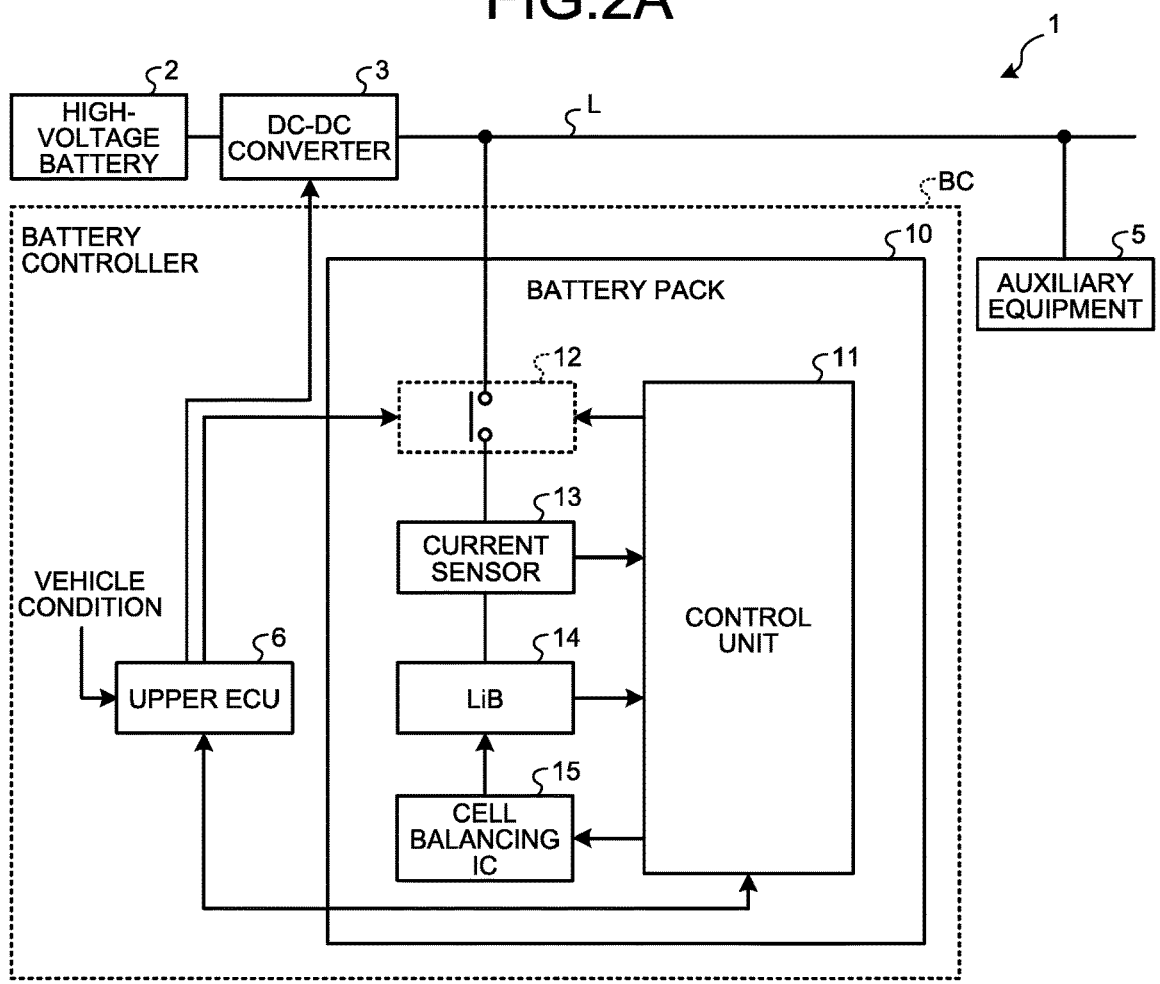
FIG. 2A is a block diagram of an electric power supply system of the embodiment.
Figure 2B:
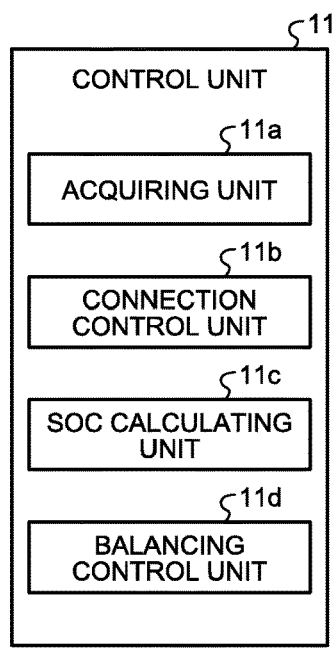
FIG. 2B is a block diagram of a control unit of a battery pack of the embodiment.

FIG. 2A is a block diagram of the electric power supply system 1 according to the embodiment. FIG. 2B is a block diagram of a control unit 11 of the battery pack 10 according to the embodiment. In FIG. 2A and FIG. 2B, components particularly necessary to describe the characteristics of the embodiment are illustrated in functional blocks, and common components are omitted from these diagrams.

In other words, the components of FIG. 2A and FIG. 2B are functionally conceptual and thus do not have to be physically arranged as illustrated in the diagrams. For example, the specific modes of separation and integration of the functional blocks are not limited to the illustrated modes, and all or some of the blocks are allowed to be configured in a functionally or physically dispersed or integrated manner in any unit, based on various loads and conditions of use.

As illustrated in FIG. 2A, the electric power supply system 1 includes the high-voltage battery 2, the DC-DC converter 3, the auxiliary equipment 5, and the battery controller BC. Since the high-voltage battery 2, the DC-DC converter 3, and the auxiliary equipment 5 have already been described, an example configuration of the battery controller BC will be mainly described.

The battery controller BC includes the upper ECU 6 and the battery pack 10. The battery pack 10 includes a control unit 11, a switching unit 12, a current sensor 13, the LiB 14, and a cell balancing integrated circuit (IC) 15.

The upper ECU 6 is a superordinate ECU to the battery pack 10 and constantly acquires conditions of the vehicle from sensors and other units mounted on the vehicle to control the battery pack 10 based on the conditions of the vehicle.

The upper ECU 6 gives the switching unit 12 a permission to be turned off, based on the conditions of the vehicle, for example, on the above "certain condition of the vehicle". The upper ECU 6 then controls the control unit 11 to turn off the switching unit 12.

After the control unit 11 turns off the switching unit 12 in the "certain condition of the vehicle", once the upper ECU 6 receives the notification that SOC calculation and cell balancing have been completed from the control unit 11, the upper ECU 6 gives the switching unit 12 a permission to be turned on. The upper ECU 6 then controls the control unit 11 to turn on the switching unit 12.

The upper ECU 6 causes the control unit 11 to keep the switching unit 12 on, for example, except when the vehicle is under the "certain condition".

The upper ECU 6 acquires information relating to the LiB 14 from the control unit 11. The information relating to the LiB 14 includes, for example, the SOC estimated by the control unit 11.

The switching unit 12 may be a relay circuit, and is connected between an auxiliary power line L extended from the DC-DC converter 3 and the LiB 14. The control unit 11 controls the state of connection (provides on-off control) of the switching unit 12.

The current sensor 13 is connected between the switching unit 12 and the LiB 14 to detect the current value of the LiB 14 and outputs the value to the control unit 11. The LiB 14 is a lithium ion secondary battery, and is used as an auxiliary battery as described above. The LiB 14 outputs the cell voltage and the cell temperature to the control unit 11.

The cell balancing IC 15 receives an instruction from the control unit 11 and conducts cell balancing to equalize the energy capacity between a plurality of cells connected in series in the LiB 14.

The control unit 11 will now be described. The control unit 11 is a controller and is implemented, for example, with a central processing unit (CPU) and a micro processing unit (MPU), and the like unit executing computer programs stored in a memory device (not illustrated) in the battery pack 10, using a random access memory (RAM) as a work area. The control unit 11 may be implemented by an integrated circuit such as an application specific integrated circuit (ASIC) and a field programmable gate array (FPGA).

As illustrated in FIG. 2B, the control unit 11 includes an acquiring unit 11a, a connection control unit 11b, an SOC calculating unit 11c, and a balancing control unit 11d, and implements or executes functions and actions relating to information processing described below.

The acquiring unit 11a constantly acquires conditions of the vehicle from the upper ECU 6. Based on the condition of the vehicle acquired by the acquiring unit 11a, the connection control unit 11b outputs a turn-off operation signal to the switching unit 12 and turns off the switching unit 12 and disconnects the LiB 14 from the auxiliary power line L, for example, when the vehicle is under the above "certain condition".

The connection control unit 11b disconnects the LiB 14 from the auxiliary power line L, and then causes the SOC calculating unit 11c to carry out SOC calculation and causes the balancing control unit 11d to control cell balancing, which will be described later. After completion of the SOC calculation and cell balancing, the connection control unit 11b outputs a turn-on operation signal to the switching unit 12 to turn on the switching unit 12 and connects the LiB 14 to the auxiliary power line L.

The connection control unit 11b keeps the switching unit 12 on and maintains the LiB 14 in connection with the auxiliary power line L, for example, except when the vehicle is "under the certain condition".

As described above, the "certain condition of the vehicle" may include when the vehicle has the IG on with the travel speed staying zero. In this state with the IG on, the DC-DC converter 3 is operating and thus continuously feeding electric power to the auxiliary power line L. Disconnection of the LiB 14 from the auxiliary power line L therefore causes no trouble.

At some travel speeds (at a speed higher than zero), a sharp change in the voltage may occur due to, for example, operation of the electric power steering (EPS). In this situation, the LiB 14 needs to function as a buffer to mitigate the change in the voltage. At speeds higher than zero, the connection control unit 11b therefore keeps the switching unit 12 on without turning off the switching unit 12. In this manner, the switching unit 12 is kept on if disconnection of the LiB 14 from the auxiliary power line L may cause trouble.

Another example of the "certain condition of the vehicle" may be the time when the vehicle transitions from the IG-on state to the IG-off state in response to operation of the user. The connection control unit 11b outputs the turn-off operation signal to the switching unit 12 and turns off the switching unit 12 and disconnects the LiB 14 from the auxiliary power line L, while the DC-DC converter 3 is still operating in the stop sequence of the vehicle.

While the DC-DC converter 3 is operating, the connection control unit 11b causes the SOC calculating unit 11c to perform SOC calculation and the balancing control unit 11d to control cell balancing. Upon completion of the SOC calculation and cell balancing, the connection control unit 11b outputs the turn-on operation signal to the switching unit 12 and turns on the switching unit 12 and connects the LiB 14 to the auxiliary power line L. The upper ECU 6 then stops the DC-DC converter 3.

When the connection control unit 11b disconnects the LiB 14 from the auxiliary power line L, the SOC calculating unit 11c calculates the SOC using a certain algorithm based on a value detected by the current sensor 13 and the OCV and outputs the result of calculation to the upper ECU 6. The certain algorithm for calculation of the SOC is a known algorithm, and description thereof is omitted. When the SOC calculation is completed, the SOC calculating unit 11c notifies the upper ECU 6 of completion of SOC calculation.

When the connection control unit 11b disconnects the LiB 14 from the auxiliary power line L and the SOC calculating unit 11c completes SOC calculation, the balancing control unit 11d controls the cell balancing IC 15 to perform cell balancing on the LiB 14. When the cell balancing is completed, the balancing control unit 11d notifies the upper ECU 6 of completion of cell balancing.

Figure 3:
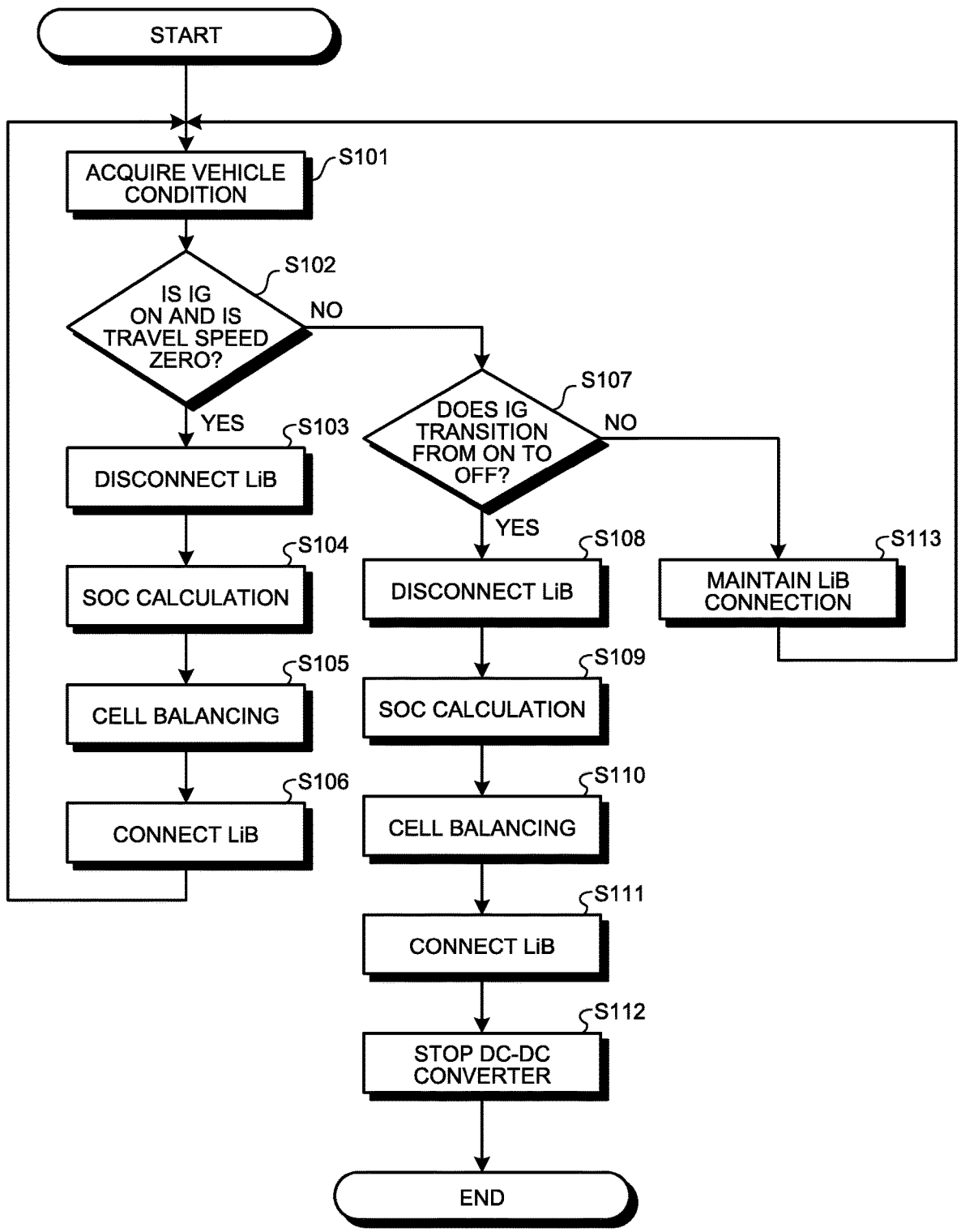
FIG. 3 is a flowchart that illustrates a processing procedure executed by a battery controller of the embodiment.

A processing procedure executed by the battery controller BC of the embodiment will now be described with reference to FIG. 3. FIG. 3 is a flowchart illustrating the processing procedure executed by the battery controller BC of the embodiment. At the "start" of the processing procedure in the flowchart, the LiB 14 is in connection with the auxiliary power line L.

As illustrated in FIG. 3, the acquiring unit 11a acquires the condition of the vehicle through the upper ECU 6 (Step S101). If the acquired vehicle condition indicates that the IG is on and the travel speed stays zero (Yes at Step S102), the connection control unit 11b disconnects the LiB 14 from the auxiliary power line L (Step S103).

When the LiB 14 is disconnected from the auxiliary power line L, the SOC calculating unit 11c performs SOC calculation (Step S104). The balancing control unit 11d controls the cell balancing IC 15 to perform cell balancing (Step S105).

When the SOC calculation and cell balancing are completed, the connection control unit 11b connects the LiB 14 to the auxiliary power line L (Step S106). The processing is repeated from Step S101.

If the vehicle condition does not indicate that the IG is on or the travel speed stays zero (No at Step S102), it is determined whether the vehicle has just transitioned from the IG-on state to the IG-off state in response to operation by the user (Step S107).

If the vehicle fits with this state (Yes at Step S107), the connection control unit 11b disconnects the LiB 14 from the auxiliary power line L before the DC-DC converter 3 is stopped (Step S108).

When the LiB 14 is disconnected from the auxiliary power line L, the SOC calculating unit 11c calculates the SOC (Step S109). The balancing control unit 11d controls the cell balancing IC 15 to perform cell balancing (Step S110).

Upon completion of the SOC calculation and cell balancing, the connection control unit 11b connects the LiB 14 to the auxiliary power line L (Step S111). The upper ECU 6 stops the DC-DC converter 3 (Step S112), and the processing ends.

At Step S107, if the vehicle condition is not determined to have transitioned from the IG-on to the IG-off state (No at Step S107), the connection control unit 11b maintains connection of the LiB 14 to the auxiliary power line L (Step S113). The processing is then repeated from Step S101.

As described above, the battery controller BC of the embodiment includes the LiB 14 (corresponding to an example "auxiliary battery"), the connection control unit 11b, the SOC calculating unit 11c (corresponding to an example "calculating unit"), and the balancing control unit 11d. The LiB 14 is a lithium ion secondary battery, and is connectable to or disconnectable from the auxiliary power line L of the vehicle. The connection control unit 11b disconnects the LiB 14 from the auxiliary power line L when the vehicle is under "the certain condition". When the LiB 14 is disconnected by the connection control unit 11b, the SOC calculating unit 11c calculates the SOC (corresponding to an example "state of charge") of the LiB 14. Furthermore, when the LiB 14 is disconnected by the connection control unit 11b, the balancing control unit 11d executes balancing control to equalize the amount of charge between cells of the LiB 14.

The battery controller BC of the embodiment is advantageous in improving the accuracy of the SOC and performance of the LiB 14, and therefore ensures the accuracy and the quality of electric power supply.

When the ignition of the vehicle is on and the travel speed stays zero, the connection control unit 11b disconnects the LiB 14 from the auxiliary power line L, and causes the SOC calculating unit 11c to calculate the SOC and the balancing control unit 11d to execute balancing control to equalize the amount of charge between cells.

The battery controller BC of the embodiment is therefore capable of disconnecting the LiB 14 at a proper timing that causes no trouble on the vehicle operation, and conducting SOC calculation and cell balancing.

The auxiliary power line L is fed with electric power from the high-voltage battery 2, the electric power having a voltage stepped down through the DC-DC converter 3. When the ignition of the vehicle transitions from the on state to the off state, the connection control unit 11b disconnects the LiB 14 from the auxiliary power line L before the DC-DC converter 3 is stopped. The connection control unit 11b causes the SOC calculating unit to calculate the SOC and causes the balancing control unit 11d to execute balancing control to equalize the amount of charge between cells.

The battery controller BC of the embodiment is thus capable of conducting SOC calculation and cell balancing at a proper timing before the DC-DC converter 3 is stopped, in the stop sequence of the vehicle.

After completion of SOC calculation by the SOC calculating unit 11c and completion of cell balancing to equalize the amount of charge between cells under control of the balancing control unit 11d, the connection control unit 11b connects the LiB 14 to the auxiliary power line L.

The battery controller BC of the embodiment ensures the accuracy and the quality of electric power supply by making sure to connect the LiB 14 to the auxiliary power line L upon completion of the SOC calculation and cell balancing.

In the above embodiment, the battery controller BC consists of the upper ECU 6 and the battery pack 10; however, the embodiment is not limited to this example configuration. For example, the battery controller BC of the embodiment may consist of only the battery pack 10. In another example configuration, the battery controller BC may consist of a combination of the upper ECU 6 and the battery pack 10. The battery controller BC may be configured as an integrated controller that integrally controls the entire electric power supply system 1 of the vehicle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A battery controller, comprising:
    an auxiliary battery that is a lithium ion secondary battery and is connectable to or disconnectable from an auxiliary power line of a vehicle;
    a connection control unit that disconnects the battery from the auxiliary power line under a certain condition of the vehicle;
    a calculating unit that calculates a state of charge of the battery when the battery is disconnected by the connection control unit; and
    a balancing control unit that executes balancing control to equalize an amount of charge of a plurality of cells of the battery when the battery is disconnected by the connection control unit,
    wherein, when an ignition of the vehicle is in an on state and a travel speed of the vehicle is zero, the connection control unit disconnects the battery from the auxiliary power line and causes the calculating unit to calculate the state of charge and causes the balancing control unit to execute balancing control to equalize the amounts of charge of the plurality of cells.

2. The battery controller according to claim 1, wherein
    the auxiliary power line is fed with electric power from a main battery, the electric power having a voltage stepped down through a converter, and
    when the ignition of the vehicle transitions from an on state to an off state, the connection control unit disconnects the battery from the auxiliary power line, causes the calculating unit to calculate the state of charge, and causes the balancing control unit to execute balancing control to equalize the amounts of charge of the plurality of cells, before the converter is stopped.

3. The battery controller according to claim 1, wherein, upon completion of calculation of the state of charge by the calculating unit and balancing control to equalize the amounts of charge of the plurality of cells under the control by the balancing control unit, the connection control unit connects the battery to the auxiliary power line.

4. The battery controller according to claim 2, wherein, upon completion of calculation of the state of charge by the calculating unit and balancing control to equalize the amounts of charge of the plurality of cells under the control by the balancing control unit, the connection control unit connects the battery to the auxiliary power line.

5. A method of battery control using a battery controller including an auxiliary battery, the battery being a lithium ion secondary battery and connectable to or disconnectable from an auxiliary power line of a vehicle, the method comprising:
    controlling connection to disconnect the battery from the auxiliary power line under a certain condition of a vehicle;
    calculating a state of charge of the battery when the battery is disconnected by the controlling connection;
    controlling balancing to equalize amounts of charge of a plurality of cells of the battery when the battery is disconnected by the controlling connection; and
    when an ignition of the vehicle is in an on state and a travel speed of the vehicle is zero, the battery is disconnected from the auxiliary power line, the state of charge is calculated, and balancing control is executed to equalize the amounts of charge of the plurality of cells.

* * * * *